(12) United States Patent  
Wedel

(10) Patent No.: US 7,241,141 B2  
(45) Date of Patent: Jul. 10, 2007

(54) LOW CONTACT SIC BOAT FOR SILICON NITRIDE STRESS REDUCTION

(75) Inventor: Darin Keith Wedel, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/230,116

(22) Filed: Sep. 19, 2005

(65) Prior Publication Data

US 2007/0082314 A1    Apr. 12, 2007

(51) Int. Cl.  
*F27D 5/00*    (2006.01)
(52) U.S. Cl. .................. 432/258; 432/259; 211/41.18
(58) Field of Classification Search .............. 432/6, 432/253, 258, 259; 211/41.18  
See application file for complete search history.

(56) References Cited

U.S. PATENT DOCUMENTS

| 4,653,636 A | 3/1987 | Armstrong |
| 5,858,103 A * | 1/1999 | Nakajima et al. ........... 118/728 |
| 6,033,215 A * | 3/2000 | Ohsawa ....................... 432/258 |
| 6,206,197 B1 * | 3/2001 | Decamps et al. ........... 206/711 |
| 6,361,313 B1 * | 3/2002 | Beyaert et al. ............. 432/259 |
| 6,450,346 B1 * | 9/2002 | Boyle et al. ............. 211/41.18 |

* cited by examiner

Primary Examiner—Gregory Wilson  
(74) *Attorney, Agent, or Firm*—Peter K. McLarty; W. James Brady, III; Frederick J. Telecky, Jr.

(57) ABSTRACT

A vertical wafer boat for supporting at least one semiconductor wafer, formed by a process includes forming a plurality of angled support grooves into a plurality of support members with a groove-making machine. Each support member extends along a longitudinal axis and each of the support grooves is spaced apart from one another and extend generally obliquely into the respective support member with respect to the longitudinal axis. The groove-making machine is positioned at a nonperpendicular angle with respect to the longitudinal axis, and thus defines an angled tooth between adjoining support grooves to support at least one wafer, and each support groove includes top and bottom corners inside a base portion that are generally supplementary with respect to each other. Top and bottom portions of the plurality of members are joined to top and bottom end plates that oppose each other respectively, to form the wafer boat.

12 Claims, 5 Drawing Sheets

LOW CONTACT SIC BOAT FOR SILICON NITRIDE STRESS REDUCTION

FIELD OF INVENTION

The present invention relates generally to the manufacture of semiconductor wafer boats and more particularly to the fabrication thereof.

BACKGROUND OF THE INVENTION

Creative methods to improve vertical wafer boats by way of their support structure, capacity, loading capability, and manufacture demand attention. Semiconductor wafers are put into heat treatment furnaces for various treatments involving, for example, oxidation, diffusion and thin film deposition. A wafer boat is used as a support mechanism for conducting such processes. The boat is robotically loaded with wafers by a transfer fork. Then, the boat is vertically placed into a furnace while support grooves within the members of the boat hold the wafers. One treatment in particular involves low-pressure chemical vapor deposition (LPCVD) that results in a thin film deposit throughout the semiconductor wafers and the internal surfaces of the wafer boat. The manufacturing process of wafer boats is relevant to such a deposition process because it defines the contact points to the wafers and structure for intense treatments.

FIG. 1 depicts a cross-sectional view of a simplified prior art wafer boat. Three semiconductor wafers sit inside support grooves illustrated by two of possibly several support members in the boat. As known by those skilled in the art, the wafer boat 10 comprises a top plate 12 and a bottom plate 14 vertically opposing one another and up to six rectangular, triangular or circular-shaped support members 16. The support members 16 connect the top and bottom plates 12, 14 to form the boat structure 10. As illustrated, protrusions 18 commonly referred to as dividers or teeth, are created that support the silicon wafers 20 at their posterior surface 22. The boats 10 are commonly made of quartz or high-purity silicon carbide and the wafers 20 are separated in a vertical direction by a distance "D" dictated by a vertical spacing of the protrusions or teeth 18. The teeth 18 present here are of an inclined ramp shape with the bottoms essentially perpendicular to the vertical support member 16.

Support teeth 18 for the wafers 20 should be as long as possible to deepen the support grooves and to prevent the occurrence of dislocation. In addition, the distance "D" between adjoining support grooves is preferably small in order to simultaneously treat as many semiconductor wafers as possible. A diamond blade or saw is necessary to carry out groove machining with high accuracy in prior art manufacturing methods. Groove machining becomes more difficult with deeper grooves and with smaller distances between adjoining grooves. Consequently, the probability increases of fractured teeth during manufacture and lower product yield.

The wafer boats require occasional cleaning by an acid in order to lower the incidences of contamination by impurities from within the boats. When the supporting grooves are deep, and the distance between adjoining supporting grooves are narrow, the supporting pieces may fracture during the cleaning operation.

In addition, particulates associated with the wafer boat that may cause defects tend to take place in the vicinity of the wafers during furnace processing. Therefore, the groove design and method by which the wafers are supported can impact the effects of such defects on the wafers. During furnace processes, such as LPCVD, a thin film deposits over the semiconductor wafer as well as the inside of the wafer boat. Afterwards, removal of a wafer generates particulates capable of forming defects on the front surface of the wafers. After several deposition processes, the wafer boat itself can generate particulates. Points of stress from buckling of deposition build-up within support grooves can generate particulates that contaminate the front active side of the wafer. This necessitates a better groove design to alleviate such points of stress and increase the longevity of the wafer boat.

With the conventional wafer boat design of prior art FIG. 1, micro-scratches and chipping particle formation is difficult to avoid as a result of the necessary contact surface between the silicon wafer and support teeth. Mechanical contact between the wafer 20 and the wafer boat teeth 18 create micro-scratches and chipping particles at the wafer backside during loading and unloading operations because of the inaccuracy of robotic placement into such narrow grooves. Because micro-scratches and chipping particles may contribute to chip defects being produced, manufacturing yields may decrease. Removal of the wafers in a systematic manner can prevent the particulates from contaminating wafers below. Robots normally remove wafers in batches of five very rapidly, so removing wafers from the bottom first prevents substantial cross contamination from other wafers.

Furthermore, each contact point 24 generates a cold zone or temperature nonuniformity associated with the wafer that can contribute to a substantial degradation of the thickness uniformity of the deposited layer. Consequently, there is a need for improved wafer boat design.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope of the invention. Rather, the primary purpose of the summary is to present one or more concepts of the invention in a simplified form as a prelude to the more detailed description that is presented later. The invention relates to a method of manufacture for an improved wafer boat that supports semiconductor wafers for processing.

The present invention involves a method of manufacture for a wafer boat that is more efficient than current methods. While concurrently aligning the support members of a wafer boat, the process involves cutting a groove portion into multiple members. The bottom and top corners of the groove are rounded in one embodiment and the top and bottom sides of the tooth portion are angled vertically. Therefore, the sides of the tooth are not perpendicular to the support member.

One aspect of the invention is to provide a method of manufacturing an improved wafer boat that significantly reduces the contact surface between the semiconductor wafers and the supporting teeth of the wafer boat.

Another aspect of the invention is to provide a process of making an improved wafer boat that significantly reduces the number of micro-scratches and chipping particles at the wafer backside during wafer processing for increased manufacturing yields.

Yet another aspect of the invention is to provide a significant particulate barrier for the front active side of the semiconductor wafer in order to prevent contamination thereof associated with chipping particles caused by wafer removal from the wafer boat.

Another aspect of the invention is to increase the longevity of the wafer boat and further decrease particulate contamination. The corners between the bottoms of each support groove are rounded in one embodiment. As a result, the wafer boat longevity increases and less particulate matter is produced by continued use of the boat. Buckling of the deposited layer over consecutive layer build-up occurs where crevices of non-uniformity exist. By making the bottom corners round a more uniform surface prevents extra particulate matter from breaking off the wafer boat.

Still another aspect of the invention is to allow easier placement of the wafers into the support grooves.

Still yet another aspect of the invention is to simplify the process of manufacturing wafer boats while reducing cost.

The present invention includes teeth that are angled in the same vertical direction at both top and bottom portions. By placing the support members concurrently side by side and forming grooves in a vertical direction the process of manufacture becomes more efficient without the need for multiple cuts for one groove and more complicated blade shapes.

In the present invention, the wafers are preferably supported at their backside within a substantial distance from their edge and with minimal contact areas. This lessens the amount of front-side contamination by the chipped particles. After thin film deposition processing, chipped particles inevitably result when the wafers are removed and broken from the deposited film joining the wafers with the boat. By minimizing the area of contact, less particulate is created upon removal of the wafers from the boat. Furthermore, by creating the points of contact within a substantial distance from the edge of the wafer, less contamination results upon the front-side of the wafer. A greater backside area shields the particulates from crossing over to the front side. Consequently, a greater manufacturing yield of quality semiconductor wafers result.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
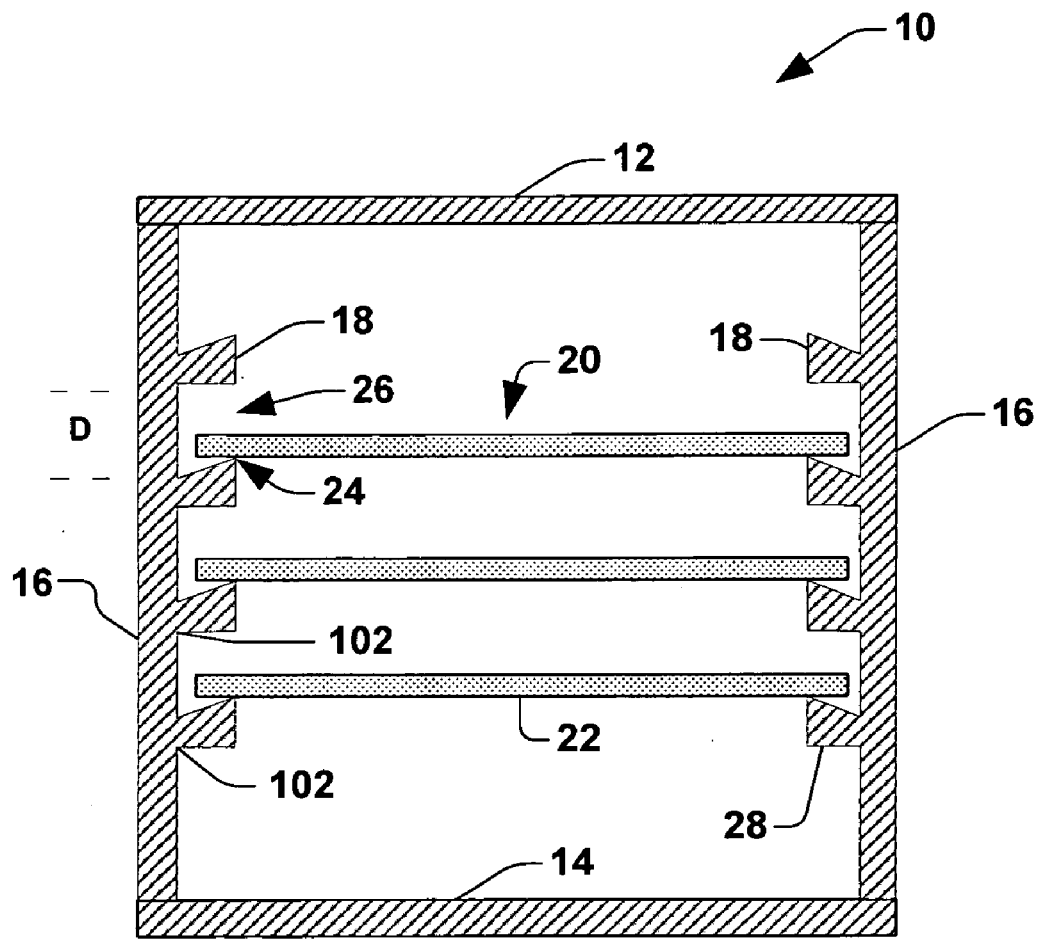
FIG. 1 is a cross-sectional diagram illustrating a conventional wafer boat of the prior art.

One or more implementations of the present invention will now be described with reference to the attached drawings, wherein like reference numerals are used to refer to like elements throughout. The invention relates to a method of manufacture for an improved wafer boat that supports semiconductor wafers for processing.

A typical depiction of the prior art is shown in FIG. 1. A cross section is provided wherein three to six support members 16 are formed within the top and bottom plates 12, 14. Grooves 26 are cut oftentimes normal or perpendicular to the supporting members 16 in order to support wafers 20 within the slots or grooves 26 defined by the teeth 18. Prior art of the present type, contain several members with teeth 18 that are inclined at a sharp point 24 contacting the backside 22 of a wafer 20 and a bottom surface 28 of the tooth being normal or perpendicular to the member 16. The corners 102 within the grooves 26 are sharp corners in contrast to the present invention in FIG. 2, as will be discussed in greater detail below.

Figure 2:
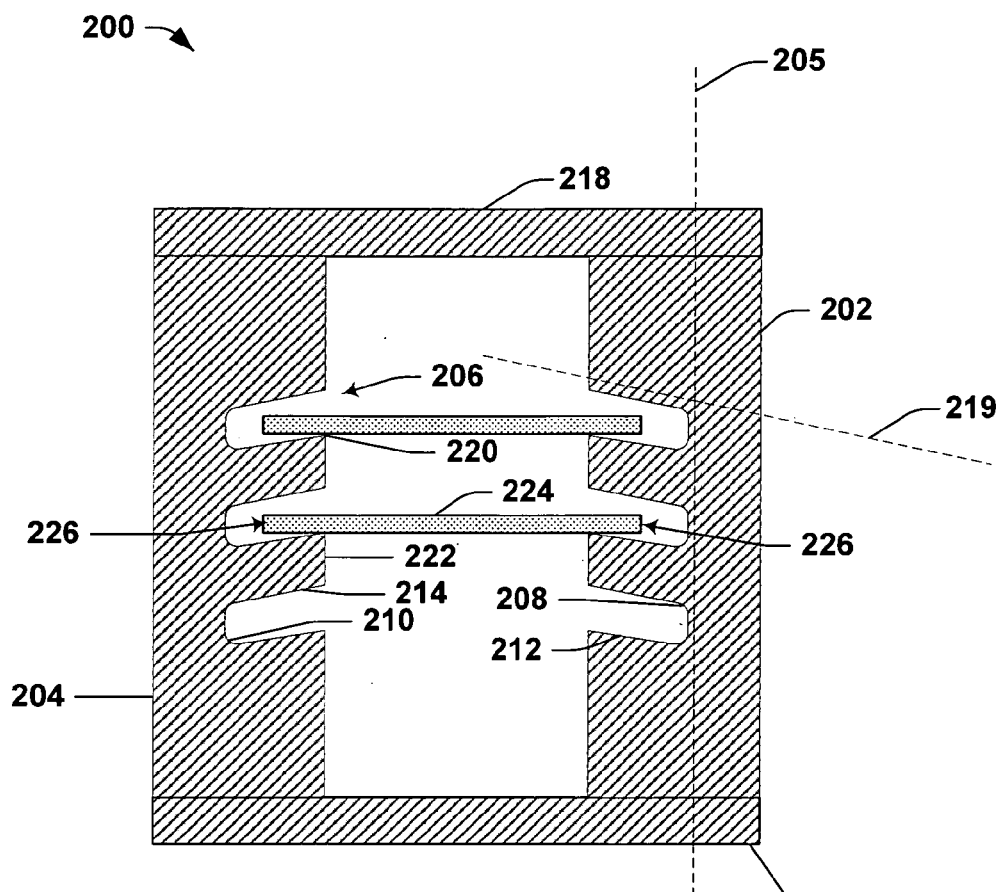
FIG. 2 is a cross-sectional diagram illustrating an exemplary wafer boat product of the process according to one aspect of the present invention.
Figure 7:
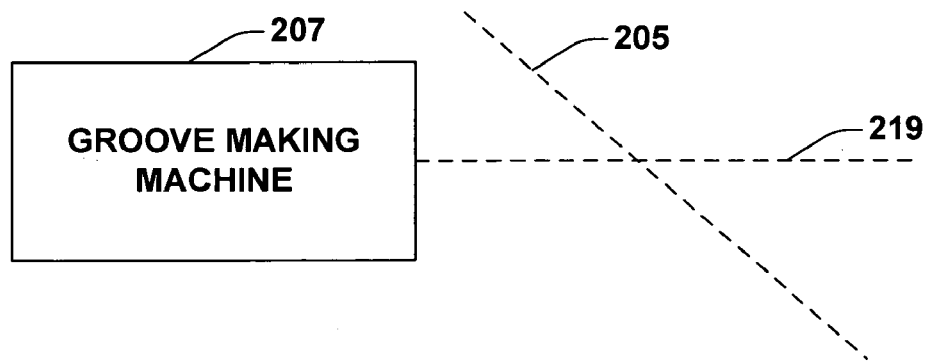
FIG. 7 illustrates a groove-making machine that may be employed to form a wafer boat according to one exemplary embodiment of the invention.

Referring initially to FIG. 2, a cross-section of a wafer boat 200 is illustrated in accordance with one aspect of the present invention. In FIG. 2, two members 202 and 204, for example comprised of silicon carbide or other suitable material, extend generally vertically along a vertical axis 205 between top and bottom plates 216 and 218, respectively. The support members have grooves or slots 206 formed therein. The groove portions 206 are cut into the members 202, 204, for example, while concurrently aligned to one another before being joined to the top and bottom plates 218, 216. The grooves 206 are made while a groove-making machine 207, for example, a saw blade, is angled generally nonperpendicularly along an axis 219 with respect to the longitudinal axis 205, as illustrated in FIG. 7. Alternatively, the aligned members may be angled with respect to the groove-making machine, for example, using a jig. In this manner, a single groove 206 may be made to all or multiple support members (e.g., two or more, and preferably three or more) with a single cut. A beveled end of a standard saw blade in one embodiment enables the top 208 and bottom 210 corners of the groove to be rounded. As a result of angled adjoining grooves, support teeth 222, are formed with a top side 212, and bottom side 214. The angled teeth 222 provide contact points 220 on which the wafer 224 is supported on a sharp corner within a substantial distance from an edge 226 of the wafer.

In the above example a rounded saw blade is employed to cut the grooves 206 in the support members 202, 204, thereby defining rounded interior portions 208, 210 of the grooves while keeping the contact region 220 thereof relatively sharp. The above exemplary configuration advantageously minimizes a contact area in which the teeth 222 physically contact the backside of the wafer 224. Alternatively, the support members 202, 204 may be subjected to a physical or chemical etch or grind process to round the interior corners 208, 210. In such instance, if one wishes to maintain the contact regions 220 of the tooth sharp, a sacrificial material may be applied thereto to mask such contact regions. Alternatively, other masking procedures may be employed and are contemplated as falling within the scope of the present invention.

Figures 3, 4:
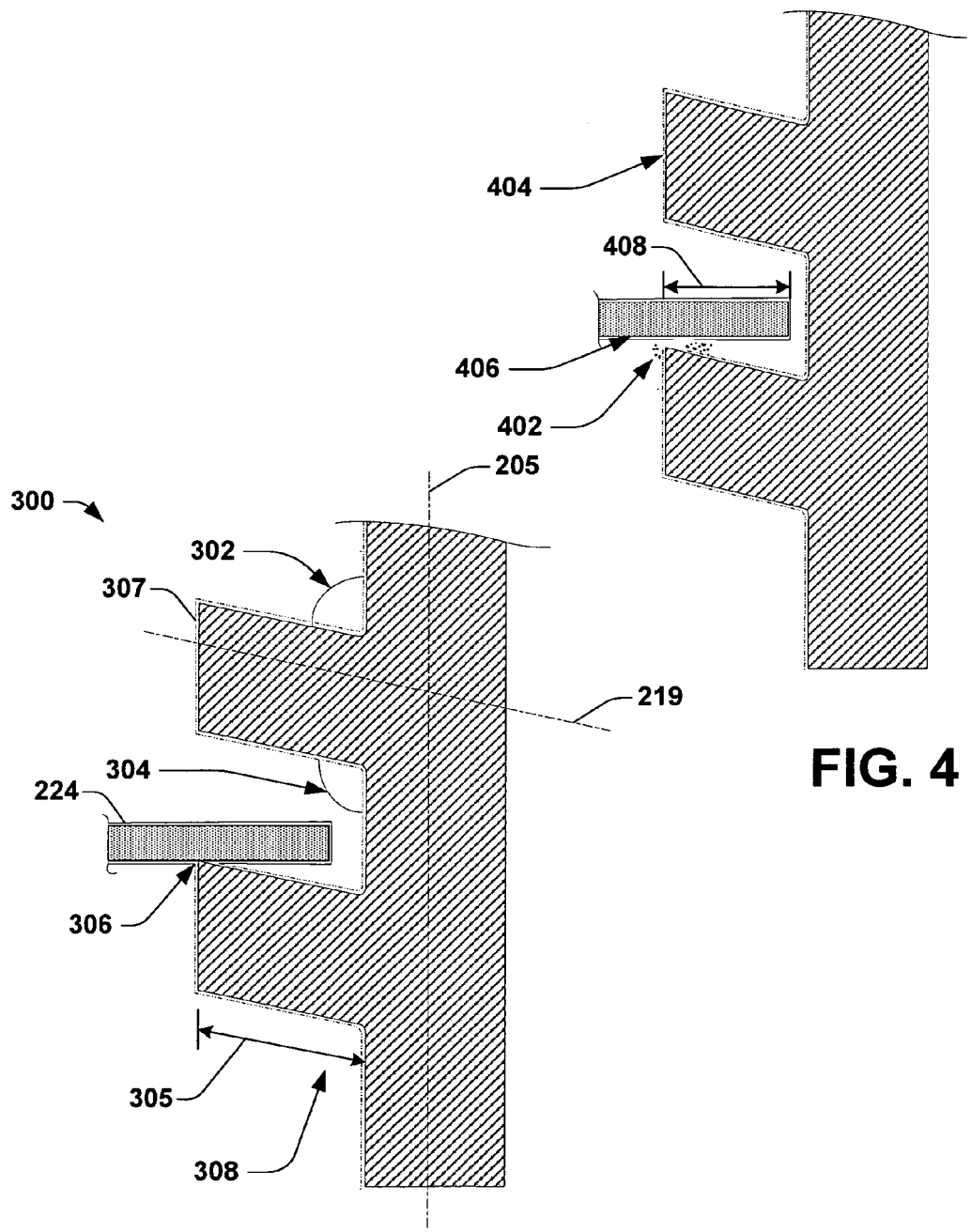
FIG. 3 is an enlarged diagram of a portion of the support member of FIG. 2 demonstrating the deposited layer and points of contact to the wafer that is consistent with the process of manufacture according to the invention.
FIG. 4 is an enlarged diagram of a portion of the support member of FIG. 2 demonstrating the particulate formation resulting in removal of a wafer and the shielding that occurs by the wafer backside.

In one example, as illustrated in FIG. 3, the angle 302 of the corner with respect to the longitudinal axis 205 is about 3 degrees or more and about 6 degrees or less to allow enough tolerance for robots to transfer wafers into and out of the slots rapidly and reliably. The length 305 of a groove depth is about 8 mm in one example for wafer boats holding wafers 200 mm in diameter, however, other depths may be employed and are contemplated by the present invention. The contact surface 306 for one groove upon the backside of the wafer has been reduced by more than 70% compared to wafers that are not suspended by an angled groove and lay flat or extend generally perpendicular to the support member. A normal deposition film 307 is shown in FIG. 3 where uniformity is more consistent at the rounded groove portion 308, than would otherwise be present with corners of prior art 102 of FIG. 1, where the corners are sharp and lead to more particulates. Accordingly, the rounded corners 308 of the present invention advantageously reduce particulate contamination over prior art wafer boat designs.

FIG. 4 demonstrates the particulates 402 that are generated by normal removal of the wafer from the wafer boat after furnace processes. The film 404 surrounds the wafer and the wafer boat after processing so that the wafer is weakly cemented to the boat by the film 404 Particulates are generated at the backside 406, within a distance 408 of at least 8 mm from the edge in order to prevent front side contamination due to the particulates 402. Since particulates can spread out about 20–40 mm, the distance 408 may advantageously be greater than 8 mm, as may be desired.

Figure 5:
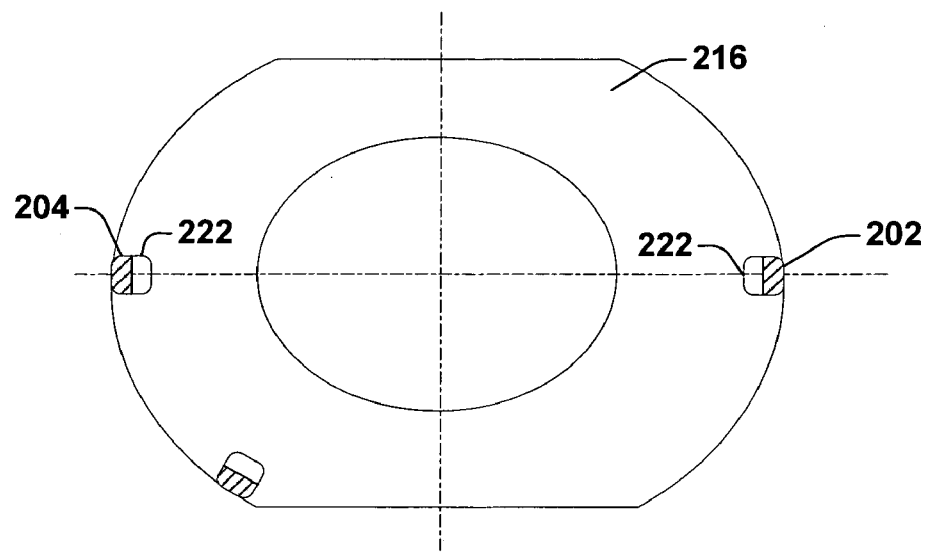
FIG. 5 illustrates an exemplary top-view of an exemplary wafer boat according to one aspect of the present invention.
Figure 6:
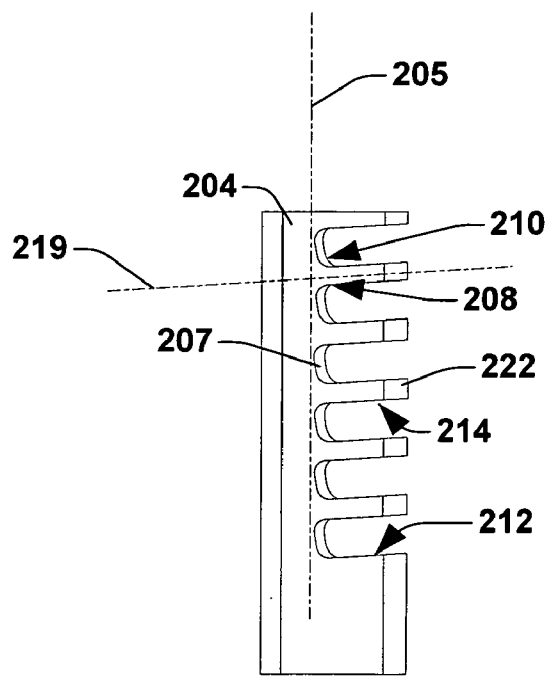
FIG. 6 is a perspective view of support grooves within a support member of the wafer boat according to an exemplary aspect of the present invention.

Another significant feature of the present invention is that the support members are limited to three in one example, that suffice to define a plane to support the wafer, as shown by the top view of FIG. 5. While limiting the support members to three is advantageous in reducing the number of support member, the wafer boat of the present invention may include additional support members and such variations are contemplated by the present invention FIG. 6 depicts the dimensions of a groove of the present invention. Note that each groove 206 has a base portion 207 having top 208 and bottom 210 corners associated therewith, wherein such top and bottom portions generally are supplementary with respect to one another. Therefore in the above example, the top corner 208 forms an acute angle while the bottom corner 210 forms an obtuse angle with the longitudinal axis 205. Having the corners 208 and 210 generally supplementary with respect to one another advantageously facilitates a reliable fabrication of the support members, wherein the grooves 206 may be formed by cutting in a single cutting step with, for example, a saw. Prior art wafer boats, having non-supplementary angles (e.g., with a bottom surface of a groove being substantially perpendicular to a vertical axis), however, generally require multiple formation steps.

While the figures provided herein illustrate support members with only a small number of grooves, it should be understood that the figures are provided merely for simplicity of illustration. The present invention further contemplates a wafer boat having any number of grooves, and will in many instances be a substantially larger number than illustrated herein.

Another significant feature is the rounding of the corners within the groove. The rounded corners are an essential feature because during normal thermal heating and cooling within the furnace, the boats themselves under go extreme stress that leads to particulate break off at these stress points. A more uniform surface at these stress points allows for greater elasticity and therefore, less particulate contamination within the wafer environment. Because the edges of the wafer are in near proximity to the corners the probability of front side contamination would otherwise be greater.

Furthermore, the rounding of the groove corners provide stronger support to the groove during machining, and thereby reducing fracture rates.

TABLE 1

| Example | Average radius (mm) | Fracture rate of grooves | Inner wall of grooves | |
|---|---|---|---|---|
| | | | Surface roughness (μm) | Flatness (mm) |
| 1 | 0.02 (nearly right angles) | 0.86% | 125 | 0.12 |
| 2 | 0.1 | 0.16% | 58 | 0.07 |
| 3 | 0.3 | 0.02% | 22 | 0.04 |
| 4 | 0.5 | 0.00% | 5 | 0.04 |

The table 1 indicates that when the corners between the bottoms of the supporting grooves and the bases of the supporting teeth were rounded with a radius of not less that 0.1 mm the fracture rate in groove machining can be extremely reduced.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A vertical wafer boat for supporting at least one semiconductor wafer, formed by a process comprising:
    forming a plurality of angled support grooves into a plurality of support members with a groove-making machine, each support member extending along a longitudinal axis and each of the support grooves spaced apart from one another and extending generally obliquely into the respective support member with respect to the longitudinal axis, wherein the groove-making machine is positioned at a nonperpendicular angle with respect to the longitudinal axis, thereby defining an angled tooth between adjoining support grooves to support at least one wafer, wherein each support groove comprises, top and bottom corners inside a base portion of the support groove angled generally supplementary with respect to each other; and joining respective top and bottom portions of the plurality of members to top and bottom end plates opposing each other respectively, to form the wafer boat;

wherein the bottom corner of each groove is acute and the top corner of each groove is obtuse with respect to the longitudinal axis, thereby defining both sides of the angled tooth as vertically slanted and non-normal with respect to the longitudinal axis; and wherein the angled tooth is configured to support a wafer at a point of minimum contact to the backside of the wafer and within a distance from an edge thereof.

2. The wafer boat of claim 1, wherein the corners formed between the bottom and top of the support grooves are rounded.

3. The wafer boat of claim 2, wherein the rounded corners are formed by cutting the grooves with the groove-making machine comprising a beveled saw blade.

4. The wafer boat of claim 1, wherein a substantially concurrent single angled incision to the plurality of members forms at least one support groove in all members.

5. The wafer boat of claim 4, wherein the angle of the incision from an axis normal to the longitudinal axis is about 3° or more.

6. The wafer boat of claim 5, wherein the angle of the incision from an axis normal to the longitudinal axis is about 6° or less.

7. The wafer boat of claim 1, wherein the angled support groove is formed into a plurality of members each member extending along a longitudinal axis, wherein the members are at an angle with respect to the groove-making machine.

8. The process of claim 1, wherein the top and bottom angle inside the support groove is rounded.

9. The wafer boat of claim 8, wherein the rounded corners are formed by cutting the grooves with the groove-making machine comprising a beveled saw blade.

10. The wafer boat of claim 8, wherein the rounded corners are formed by subjecting the support members after subjection to the cutting implement to an etching process, thereby rounding the top and bottom corners of each groove.

11. The wafer boat of claim 10, wherein each angled tooth is masked at a distal portion thereof prior to subjecting the support members to the etching process, thereby preventing a rounding of the distal portion of each tooth.

12. A wafer boat for supporting at least one semiconductor wafer, formed by a process comprising:

concurrently forming a plurality of angled support grooves into a plurality of support members by aligning the support members with respect to one another and cutting a support groove into each of the support member with a single pass of a cutting implement, each support member extending along a longitudinal axis and each of the support grooves spaced apart from one another along the longitudinal axis, and each groove extending generally obliquely into the respective support member with respect to the longitudinal axis, wherein the support members are at a nonperpendicular angle with respect to the cutting implement, thereby defining an angled tooth between adjoining support grooves to support at least one wafer, wherein each support groove comprises, top and bottom corners inside a base portion of the support groove angled generally supplementary with respect to each other; and joining the plurality of members to top and bottom end plates opposing each other respectively, to form the wafer boat;

wherein the bottom corner of the support groove is acute and the top angle of the support groove is obtuse and non-normal with respect to the longitudinal axis so that the tooth is vertically inclined at both top and bottom; and wherein the tooth is configured to support a wafer at a point of minimum contact to the backside of the wafer and within a distance from an edge thereof.

* * * * *